(12) United States Patent
Kundu et al.

(10) Patent No.: US 9,568,550 B1
(45) Date of Patent: Feb. 14, 2017

(54) IDENTIFYING FAILURE INDICATING SCAN TEST CELLS OF A CIRCUIT-UNDER-TEST

(71) Applicant: Synopsys, Inc., Mountain View, CA (US)

(72) Inventors: Subhadip Kundu, Bangalore (IN); Parthajit Bhattacharya, Bangalore (IN); Rohit Kapur, Cupertino, CA (US)

(73) Assignee: Synopsys, Inc., Mountain View, CA (US)

( * ) Notice: Subject to any disclaimer, the term of this patent is extended or adjusted under 35 U.S.C. 154(b) by 50 days.

(21) Appl. No.: 14/835,650

(22) Filed: Aug. 25, 2015

(51) Int. Cl.
*G01R 31/28* (2006.01)
*G01R 31/3177* (2006.01)
*G01R 31/317* (2006.01)

(52) U.S. Cl.
CPC ..... *G01R 31/3177* (2013.01); *G01R 31/31718* (2013.01)

(58) Field of Classification Search
CPC ............... G01R 31/3177; G01R 31/31718
See application file for complete search history.

(56) References Cited

U.S. PATENT DOCUMENTS

| 7,962,820 B2 | 6/2011 | Rajski et al. | |
| 2006/0041812 A1* | 2/2006 | Rajski | G01R 31/318547 714/742 |

OTHER PUBLICATIONS

Chandra, A. et al., "Scalable Adaptive Scan (SAS)," Date 2009, EDAA, 2009, pp. 1476-1481.
Kundu, S. et al., "Fault Diagnosis in Designs with Extreme Low Pin Test Data Compressors," Date 2015, 2015, pp. 1285-1288.
Mrugalski, G. et al., "Fault Diagnosis in Designs with Convolutional Compactors," Proceedings ITC 2004, ITC International Test Conference, IEEE, 2004, pp. 498-507.

* cited by examiner

*Primary Examiner* — Sam Rizk
(74) *Attorney, Agent, or Firm* — Fenwick & West LLP

(57) ABSTRACT

A disclosed configuration is for identifying at least one failure indicating scan test cell of a circuit-under-test, CUT, the CUT having a plurality of scan test cells, is provided. The configuration comprises generating a plurality of error signatures by means of a compactor of the CUT, wherein each of the error signatures of the plurality of error signatures consist of a respective sequence of bits comprising at least one failure indicating bit, assigning each error signature to at least a first, a second and a third signature type according to a total number of failure indicating bits of the respective error signature and mapping at least a predefined minimum number of error signatures to respective scan test cells of the plurality of scan test cells. For each error signature, a priority of the mapping is determined by the signature type the respective error signature has been assigned to.

24 Claims, 2 Drawing Sheets

IDENTIFYING FAILURE INDICATING SCAN TEST CELLS OF A CIRCUIT-UNDER-TEST

BACKGROUND

The disclosure relates to methods for identifying at least one failure indicating scan test cell of an integrated circuit-under-test (CUT) and to a computer program product for performing such method.

Failure diagnosis may play an important role for example to ramp up yields during an integrated circuit manufacturing process. Limited observability due to test response compaction may negatively affect the diagnosis procedure. In particular, in compactor architectures with a low or very low number of outputs, for example only one output, observability may be strongly limited.

When a logic circuit fails at a test, fault diagnosis is for example used to narrow down possible locations of a defect. Fault diagnosis of scan designs with compactors are for example performed in two steps. In the first step, failures are mapped back through the compactor to the scan test cells of the CUT. In the second step, scan based fault diagnosis may be performed based on results from the first step.

Existing approaches may for example require iterations between the first step of mapping and the second step of scan based fault diagnosis. This may reduce for example time efficiency of the procedure. Furthermore, existing approaches may suffer from a limited effectivity and/or a reduced reliability of the results from the mapping.

Therefore, it is desirable to provide an improved concept for identifying failure indicating scan test cells of a CUT that allows for an improved reliability, effectivity and/or a reduced time requirement.

SUMMARY

According to the improved concept, error signatures generated by a compactor of a circuit-under-test, CUT, are assigned to different signature types. Then, the error signatures are mapped to scan test cells of the CUT in an order according to a priority, the priority being determined by the signature type. In particular, error signatures assigned to a signature type being more easy to map and/or may be mapped with a greater degree of uniqueness are mapped before mapping error signatures assigned to a signature type being harder to map and/or may be mapped with a lower degree of uniqueness.

According to the improved concept, a method for identifying at least one failure indicating scan test cell of an integrated CUT, the CUT having a plurality of scan test cells, is provided. The method comprises generating a plurality of error signatures by means of a compactor of the CUT, wherein each of the error signatures of the plurality of error signatures consist of a respective sequence of bits comprising at least one failure indicating bit. The method further comprises assigning each error signature of the plurality of error signatures to one of at least a first, a second and a third signature type according to a total number of failure indicating bits of the respective error signature. The method further comprises mapping at least a predefined minimum number of error signatures of the plurality of error signatures to respective scan test cells of the plurality of scan test cells. Therein, for each error signature of the plurality of error signatures, a priority of the mapping is determined by the signature type the respective error signature has been assigned to.

According to some implementations of the method, error signatures assigned to the first error signature type have a higher priority for the mapping than error signatures assigned to the second or the third error signature type.

According to some implementations of the method, each scan test cell of the plurality of scan test cells comprises a respective storage element, for example a flip-flop.

According to some implementations of the method, the scan test cells of the plurality of scan test cells are arranged in a plurality of scan chains, the scan chains being implemented as shift registers.

According to some implementations of the method, in order to generate the plurality of error signatures by means of the compactor, one or more test stimuli are applied to the CUT and/or a logic circuit of the CUT. Each scan test cell is connected to a respective portion of the logic circuit and a failure indicating information may be stored in the connected scan test cell upon the application of the one or more test stimuli. In case a failure indicating information is stored in a scan test cell, then the connected portion of the logic circuit is known to contain one or more failing logic gates. The failure indicating information may for example correspond to a first logic level, for example to logic high. In case the respective portion contains no failing logic gate, a non-failure indicating information is stored in the connected scan test cell upon the application of the one or more test stimuli. The non-failure indicating information may for example correspond to a second logic level, for example to logic low.

According to some implementations of the method, the compactor is configured to generate the plurality of error signatures based upon the failure indicating information and non-failure indicating information being stored in the plurality of scan test cells.

According to some implementations of the method, the respective sequence of bits of an error signature has a length given by a total shift number. The total shift number is for example equal for all error signatures of the plurality of error signatures and is for example determined by a total number of scan test cells comprised by the plurality of scan test cells, an arrangement of the scan test cells within the CUT and/or an architecture of the compactor.

According to some implementations of the method, each bit of an error signature is associated to a corresponding shift cycle.

According to some implementations of the method, a failure indicating bit of an error signature corresponds one of the first and the second logic level. Preferably, a failure indicating bit of an error signature corresponds to the first logic level, for example to logic high.

According to some implementations of the method, the mapping of an error signature to respective scan test cells comprises identifying one or more scan test cells that may explain or partially explain the error signature to be mapped. In particular the one or more scan test cells may explain or partially explain the error signature to be mapped if error indicating information of the one or more scan test cells may be reflected in and/or may impact the error indicating bits of the error signature to be mapped.

According to some implementations of the method, the predefined minimum number of error signatures corresponds to an absolute number of error signatures to be mapped.

According to some implementations of the method, the predefined minimum number of error signatures is given by a relative number of error signatures to be mapped, that is by a predefined minimum percentage of error signatures of the plurality of error signatures to be mapped.

According to some implementations of the method, the predefined minimum number corresponds to the greater of an absolute number of error signatures to be mapped and a minimum percentage of error signatures to be mapped.

According to some implementations of the method, the mapping is stopped when the minimum number of error signatures has been mapped.

According to some implementations of the method, the mapping is performed for error signatures being assigned to the second signature type only when all of the error signatures being assigned to the first signature type have been mapped to respective scan test cells of the plurality of scan test cells.

According to some implementations of the method, the mapping is performed for error signatures being assigned to the third signature type only when all of the error signatures being assigned to the first signature type and/or all of the error signatures being assigned to the second signature type have been mapped to respective scan test cells of the plurality of scan test cells.

According to some implementations of the method, the method further comprises determining a portion of a logic circuit of the CUT containing at least one failing logic gate based on the mapping of the at least a predefined minimum number of error signatures of the plurality of error signatures to respective scan test cells of the plurality of scan test cells.

According to some implementations of the method, the method further comprises using a scan based failure diagnosis algorithm to determine a portion of a logic circuit of the CUT containing at least one failing logic gate based on the mapping of the error signatures to respective scan test cells of the plurality of scan test cells.

According to some implementations of the method, the scan test cells of the plurality of scan test cells are arranged in a plurality of scan chains and the compactor comprises a plurality of memory elements, each having a respective input. Each scan chain comprises an output coupled to each of the respective inputs of each memory element of a respective subset of the plurality of memory elements, each of said respective subset comprising a coupling number of memory elements.

According to some implementations of the method, the plurality of memory elements are implemented as shift registers.

According to some implementations of the method, each of the scan chain of the plurality of scan test chains is implemented as a shift register.

According to some implementations of the method, each scan chain of the plurality of scan chain comprises the same number of scan test cells.

According to some implementations of the method, each scan test cell of a scan chain comprises an output, wherein the output of a first scan test cell of the scan chain corresponds to the output of the respective scan chain. An output of each scan test cell, except the first scan test cell, of the scan chain is connected to an input of a neighboring scan test cell within the scan chain.

According to some implementations of the method, the coupling number is equal for each of said subsets of memory elements.

According to some implementations of the method, the coupling number is an integer number being greater than zero, for example being greater than zero and smaller than 10, for example being equal to three.

According to some implementations of the method, an error signature is assigned to the first signature type if the total number of failure indicating bits of the respective error signature is equal to the coupling number.

According to some implementations of the method, an error signature is assigned to the first signature type if the error signature is a type I signature. Therein, a type I signature is an error signature with a total number of failure indicating bits being equal to the coupling number.

According to some implementations of the method, an error signature is assigned to the second signature type if the total number of failure indicating bits of the respective error signatures equal to an integer multiple of the coupling number but not equal to the coupling number.

According to some implementations of the method, an error signature is assigned to the second signature type if the error signature is a type II signature. Therein, a type II signature is an error signature with a total number of failure indicating bits being equal to an integer multiple of the coupling number but not equal to the coupling number.

According to some implementations of the method, an error signature is assigned to the third signature type if the total number of failure indicating bits of the respective error signature is not equal to an integer multiple of the coupling number and not equal to the coupling number.

According to some implementations of the method, an error signature is assigned to the third signature type if the error signature is a type III signature. Therein, a type III signature is an error signature with a total number of failure indicating bits being not equal to an integer multiple of the coupling number and being not equal to the coupling number.

According to some implementations of the method, the mapping of at least a predefined minimum number of error signatures of the plurality of error signatures to respective scan test cells of the plurality of scan test cells comprises selecting an error signature of the plurality of error signatures and determining for each of the scan test cells of the plurality of scan test cells a respective bit weight. Therein, the bit weight corresponds to a number of failure indicating bits of the selected error signature that may be caused by the scan test cell for which the respective bit weight is being determined.

According to some implementations of the method, the respective bit weight of a scan test cell is zero or a positive integer number that is smaller than or equal to the coupling number.

According to some implementations of the method, the bit weight of a scan test cell is, for a type I signature, either zero or equal to the coupling number.

According to some implementations of the method, the bit weight of a scan test cell is, for a type II signature, either zero or equal to the coupling number.

According to some implementations of the method, the bit weight of a scan test cell for a type III signature is either zero or a positive integer number that is smaller than or equal to the coupling number.

According to some implementations of the method, the mapping of at least a predefined minimum number of error signatures of the plurality of error signatures to respective scan test cells of the plurality of scan test cells further comprises, if the selected error signature has been assigned to the first signature type, selecting a scan test cell of the plurality of scan test cells having a maximum bit weight, defining the selected error signature as being mapped to the selected scan test cell and increasing a pattern weight of the selected scan test cell by one, wherein the pattern weight corresponds to a number of error signatures having already been mapped to the selected scan test cell.

According to some implementations of the method, the mapping of at least a predefined minimum number of error signatures of the plurality of error signatures to respective scan test cells of the plurality of scan test cells further comprises, if the selected error signature has been assigned to the second or to the third signature type, selecting a scan test cell of the plurality of scan test cells having a maximum bit weight and, if more than one scan test cell of the plurality of scan test cells has the maximum bit weight, having a maximum pattern weight and inverting each of the bits of the selected error signature that may be affected by the selected scan test cell. Therein, the pattern weight of the respective scan test cell corresponds to a number of error signatures having already been mapped to the respective scan test cell.

According to some implementations of the method, if more than one scan test cell of the plurality of scan test cells has the maximum bit weight and, at the same time, the maximum pattern weight, selecting one of said more than one scan test cells and inverting each of the bits of the selected error signature that may be affected by the selected scan test cell.

According to some implementations of the method, the steps of determining for each of the scan test cells of the plurality of scan test cells a respective bit weight, selecting a scan test cell of the plurality of scan test cells and inverting each of the bits of the selected error signature that may be affected by the selected scan test cell, are carried out repeatedly in a cyclic manner until the selected error signature does not comprise any failure indicating bits, if the selected error signature has been assigned to the second or to the third signature type.

According to some implementations of the method, the mapping of at least a predefined minimum number of error signatures of the plurality of error signatures to respective scan test cells of the plurality of scan test cells further comprises, if the selected error signature has been assigned to the second or to the third signature type, defining the selected error signature as being mapped to the selected scan test cell and increasing the pattern weight of the selected scan test cell by one.

According to some implementations of the method, the steps of determining for each of the scan test cells of the plurality of scan test cells a respective bit weight, selecting a scan test cell of the plurality of scan test cells, inverting each of the bits of the selected error signature that may be affected by the selected scan test cell, defining the selected error signature as being mapped to the selected scan test cell and increasing the pattern weight of the selected scan test cell by one, are carried out repeatedly in a cyclic manner until the selected error signature does not comprise any failure indicating bits, if the selected error signature has been assigned to the second or to the third signature type.

According to some implementations of the method, the method comprises using a hash function to map only one error signature of a subset of error signatures with identical sequences of bits.

According to some implementations of the method, the method further comprises determining a subset of error signatures of the plurality of error signatures, wherein each error signature of the subset of error signatures has the same sequence of bits. The method further comprises mapping one, in particular exactly one, representing error signature of the subset of error signatures to one or more respective scan test cells of the plurality of scan test cells and defining all error signatures of the subset of error signatures as being mapped to the one or more respective scan test cells the representing error signature has been mapped to.

According to the improved concept, a method for identifying at least one failure indicating scan test cell of an integrated CUT, the CUT having a plurality of scan test cells, is provided. The method comprises generating a plurality of error signatures by means of a compactor of the CUT, wherein each of the error signatures of the plurality of error signatures consist of a respective sequence of bits comprising at least one failure indicating bit. The method further comprises assigning each error signature of the plurality of error signatures to one of at least a first and a second signature type according to a total number of failure indicating bits of the respective error signature. The method further comprises mapping at least a predefined minimum number of error signatures of the plurality of error signatures to respective scan test cells of the plurality of scan test cells. Therein, for each error signature of the plurality of error signatures, a priority of the mapping is determined by the signature type the respective error signature has been assigned to.

According to some implementations of the method, an error signature is assigned to the first signature type if the error signature is a type I signature and to the second signature type if the error signature is a type II signature.

According to some implementations of the method, an error signature is assigned to the first signature type if the error signature is a type I signature and to the second signature type if the error signature is a type III signature.

According to some implementations of the method, an error signature is assigned to the first signature type if the error signature is a type II signature and to the second signature type if the error signature is a type III signature.

According to some implementations of the method, an error signature is assigned to the first signature type if the error signature is a type I signature and to the second signature type if the error signature is a type II or a type III signature.

According to some implementations of the method, an error signature is assigned to the first signature type if the error signature is a type II signature and to the second signature type if the error signature is a type I or a type III signature.

According to some implementations of the method, an error signature is assigned to the first signature type if the error signature is a type III signature and to the second signature type if the error signature is a type I or a type III signature.

Further implementations of methods are readily derived by combining two or more of the implementations for the methods described above.

According to the improved concept, a computer program product is provided. The computer program product comprises a code, wherein said code, when executed by at least one processor, causes the at least one processor to perform a method according to the improved concept.

According to an implementation of the computer program product, the code, when executed by at least one processor, causes the at least one processor to generate a plurality of error signatures by means of a compactor of the CUT, wherein each of the error signatures of the plurality of error signatures consist of a respective sequence of bits comprising at least one failure indicating bit. The code, when executed by at least one processor, causes the at least one processor to assign each error signature of the plurality of error signatures to one of at least a first and a second signature type according to a total number of failure indicating bits of the respective error signature. The code, when executed by at least one processor, causes the at least one processor further to map at least a predefined minimum number of error signatures of the plurality of error signatures to respective scan test cells of the plurality of scan test cells. Therein, for each error signature of the plurality of error signatures, a priority of the mapping is determined by the signature type the respective error signature has been assigned to.

Further implementations of the computer program product (or program code) are readily derived from the implementations of the described method. The program product is executable by one or more processors (and/or processing units such as controllers). In addition, the methods may be embodied within systems having hardware configurations as disclosed herein.

BRIEF DESCRIPTION OF DRAWINGS

In the following, the improved concept is explained in detail with the aid of exemplary implementations by reference to the drawings. Components that are functionally identical or have an identical effect may be denoted by identical references. Identical components and/or components with identical effects may be described only with respect to the figure where they occur first and their description is not necessarily repeated in subsequent figures.

Figure (FIG.) 1 shows an exemplary implementation of a compactor and scan test cells of a circuit-under-test suitable for the improved concept to be applied to;

FIG. 2 shows another exemplary implementation of a compactor and scan test cells of a circuit-under-test suitable for the improved concept to be applied to;

DETAILED DESCRIPTION

Figure 1:
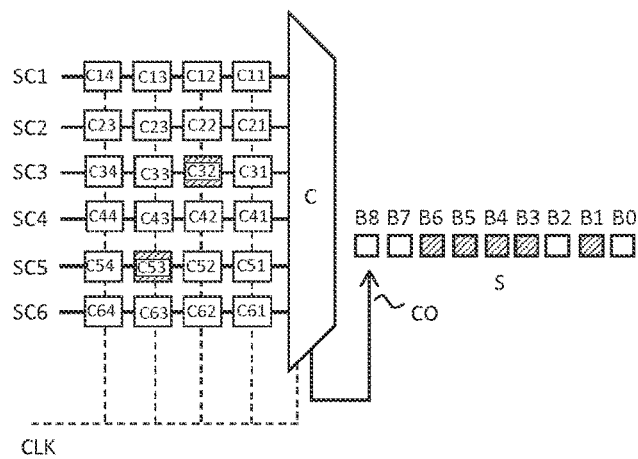

A fault or failure when present in a circuit-under test, CUT, may lead to many failing patterns represented for example by error signatures S. However, for effective diagnosis, not all failing patterns or error signatures S are required. The inventors have experimentally found that limiting and/or prioritizing the failing pattern count actually helps in accurately pinpointing a failure or fault of the CUT. The reason behind this is for example aliasing of failure responses caused by a network of a compactor C. Though convolution compactors, as compactor C shown in FIG. 1 or 2, may minimize aliasing, they may not eliminate it. Especially in the presence of Xs, aliasing may be a major concern. Therein, Xs, also denoted as "don't cares", correspond for example to compactor outputs that are unknown, for example due to uninitialized scan test cells $C11, \ldots, C64$. Such Xs may for example be relevant during simulation of a CUT.

Due to the aliasing, mapping of compactor output to a scan cell may not be unique and may lead to wrong information supplied to a failure diagnosis algorithm. Therein, the failure diagnosis algorithm uses the results from the mapping algorithm to perform failure diagnosis. Therefore, it may be better not to map these patterns or error signatures S, because a wrong mapping may lead to confusion in scan diagnosis. Therefore, it may be advantageous to map in particular patterns or error signatures S where one can be sure or there is a high probability about the mapping procedure being correct. Based on this observation, according to the improved concept, each failing pattern or error signature S may be analyzed separately and processed accordingly.

There may for example be three possibilities when mapping may be performed on failing patterns or error signatures S based on their failure response, denoted as type I signatures, type II signatures and type III signatures, respectively. A failure response may contain errors from a single scan test cell $C11, \ldots, C64$ (corresponding to type I signatures), multiple scan test cells $C11, \ldots, C64$ with their effects independent to each other (corresponding to type II signatures) or multiple can test cells $C11, \ldots, C64$ with their effects affecting each other, in particular cancelling or partially cancelling each other (corresponding to type III signatures). These three cases are for example identified and treated separately. A scan test cell $C11, \ldots, C64$ may affect a certain coupling number of, for example three, compactor shift cycles, wherein each compactor shift cycle corresponds to a bit at a corresponding position in an error signature S.

In the following, the coupling number is assumed to be three. However, this assumption is in no way limiting and all examples and explanations are readily extended to an arbitrary coupling number different from three by a person of ordinary skill in the art.

Therefore, if any failure response or error signature S contains for example three failure indicating bits, that is in the case of a type I signature, it is likely that said error signature S results from a failure information of a single scan test cell $C11, \ldots, C64$. A convolution compactor C uses for example a Steiner triple redundant system. In this case, each scan test cell $C11, \ldots, C64$ has its unique three shift cycles in the output which they can affect. This uniqueness may help the mapping algorithm to find the corresponding scan test cell $C11, \ldots, C64$.

In the second case, that is in the case of type II signatures, where two or multiple scan test cells $C11, \ldots, C64$ have captured failures, the corresponding error signature S will consist of multiple of three shift failures. The mapping algorithm needs to identify each scan test cell $C11, \ldots, C64$ and map the failure back to those scan test cells $C11, \ldots, C64$.

In the third case, that is in the case of type III signatures, mapping may become particularly complicated for example because of the possibility of aliasing due to fault or failure cancellation. According to the improved concept, information gathered from the previous steps may be used to prune the wrong candidates of scan test cells $C11, \ldots, C64$ when processing type III signatures.

According to the improved concept, type I signatures are for example treated in a first pass, type II signatures are for example treated in a second pass and type III signatures are for example treated in a third pass. Therein, the same or a similar algorithm may be used for all signature types, but during different passes.

In the first pass, for example only type I signatures are considered. It may be possible that two or three scan test cell failures result in three failure indicating bits in the error signature S, thus leading to an apparent type I signature. However, if the resulting failure indicating bits in the error signature S match those of a single scan test cell $C11, \ldots, C64$, the two cases may for example not be distinguished.

Therefore, it is safe to use error signatures or patterns with three shift failures and map them.

In the second pass, for example only patterns with multiple of three failures, that is type II signatures, are considered. Therein, it is for example assumed that the shift cycles of each failure indicating scan test cell C11, . . . , C64 do not cancel each other. Then, the uniqueness of individual scan test cells C11, . . . , C64 is still preserved. Therefore, mapping is also safe for these patterns.

In the third pass, if a predefined minimum number of error signatures S to be mapped is still not reached, for example type III signatures are mapped. Information gathered from the previous passes may be used to prune out false candidates of scan test cells C11, . . . , C64 in order to map type III signatures correctly to respective scan test cells C11, . . . , C64.

Performing the mapping over many passes may help to target error signatures S which are easy and safe to map first and use the gained information for mapping the difficult error signatures S. Information that may be used may in particular comprise information about which scan test cells C11, . . . , C64 have already explained an error signature S. In particular, the information may comprise information about the total number of error signatures S that have been already mapped to a respective scan test cell C11, . . . , C64. Based on this information, for example a pattern weight can be assigned to each of the scan test cells C11, . . . , C64 during the mapping and used during the further course of the mapping for decision making.

The algorithm used for mapping may for example be a greedy branch and bound based technique. From an error signature S, first the failure indicating bits and the corresponding shift cycles are identified. A bit weight is assigned to each scan test cell C11, . . . , C64, the bit weight corresponding to a number of failure indicating bits of the error signature S that may be explained by that scan test cell C11, . . . , C64. The maximum weight of a particular scan test cell C11, . . . , C64 is given by the coupling number, that is for example three. Once the bit weight has been calculated for each scan test cell C11, . . . , C64, the scan test cell C11, . . . , C64 with maximum bit weight is selected. The error signature S is modified by setting the logic high bits, which are explained by the selected scan test cell C11, . . . , C64, to logic low. If there is any bit of the error signature S which is initially logic low, but is in the list of bits impacted by the selected scan test cell C11, . . . , C64, that bit is set to logic high, in particular if an X is not present in that bit.

The bit weight of the remaining cells is calculated based on the modified error signatures S. The procedure repeats it until all bits of the error signature S are set to logic low. The algorithm may also trace back when it is impossible to select and use a scan test cell. The algorithm returns to the parent node in the tree and tries another scan test cell C11, . . . , C64. In this way, it can be guaranteed to find a solution for the error signature S. The solution consists of all scan test cells C11, . . . , C64 according to which the error signature S is modified along the branch leading to all bits of the error signature S being set to logic low.

Each scan test cell C11, . . . , C64 can have three associated weights, the bit weight, the pattern weight and an X-weight. The pattern weight of a scan test cell C11, . . . , C64 is, as explained above, the count of error signatures S in which the respective scan test cell C11, . . . , C64 has been found as a correct candidate for explaining the error signature S. The X-weight of a respective scan test cell C11, . . . , C64 is the number of bits in the X responds that may be affected or impacted by the respective scan test cell C11, . . . , C64. Presence of Xs may change the error signature S as well as the failure response. For example, if there is a single cell failure resulting in a three bit failure at the compactor output. Due to presence of an X, and one shift cycle the failure got canceled. Now, many scan test cells C11, . . . , C64 along with the correct one will have a bit weight equal to two. However, the actual cell will have an X-weight that can be used to identify the correct cell. In this way, Xs may also be handled by the mapping algorithm and the improved concept. Using the various weights helps to prune wrong scan test cells C11, . . . , C64 in case there is no unique scan test cell C11, . . . , C64 to be selected.

An exemplary processing for the mapping procedure provided in pseudo program code as follows:

Require: Failure responses/Error signatures of a test set at the compactor output
Ensure: Failures mapped at scan cells for failed patterns/ Error signatures
1: pass=0,
2: while pass≤2 and mapped error signatures≤minimum number of error signatures do
3: for error signature=first error signature to error signature≤last error signature do
4: total failures=number of failures for the error signature
5: if ((pass==0) and (total failures≠3)) then
6: continue
7: end if
8: if ((pass==1) and (total failures %3≠0) and (total failures==3)) then
9: continue
10: end if
11: Map the pattern according to branch and bound algorithm described
12: end for
13: pass=pass+1
14: end while
15: for all Error signatures that are not mapped do
16: Pattern type is set to skipped
17: end for
18: return A number of scan test cells to be mapped for a given error signature S may be limited according to its total number of failure indicating bits. Since each scan test cell C11, . . . , C64 may have three bit failures, an initial value of the cell limit may be set by dividing the total number of failure indicating bits by three. The mapping procedure tries to find out a solution within this cell limit. If it is unable to do so, the cell limit is increased by one and the mapping procedure starts from the beginning.

Error signatures S which are not mapped may be marked as skipped in this way. During a scan based fault diagnosis, these patterns may be ignored. They may for example not be considered in any further analysis.

FIG. 1 shows an exemplary implementation of a compactor C and scan test cells C11, . . . , C64 of a CUT suitable for the improved concept to be applied to.

The CUT comprises 24 scan test cells C11, . . . , C64 arranged in six scan chains SC1, . . . , SC6, each of the scan chains SC1, . . . , SC6 having four scan test cells. Each scan test cell C11, . . . , C64 may for example be implemented as a flip-flop. The scan test cells C11, . . . , C64 of a given scan chain SC1, . . . , SC6 are coupled in series to each other to form a shift register and outputs of the first scan cells C11, C21, . . . , C61 are coupled to the respective inputs of the compactor C, which is for example implemented as a convolutional compactor. Furthermore, each scan test cell C11, . . . , C64 is supplied with a clock signal CLK.

The compactor C is also supplied with the clock signal CLK. The compactor C has an output CO at which it generates an error signature S.

Initially, a test stimulus is applied to the CUT and, based on the test stimulus and its processing by the CUT, initial values are stored in each of the scan test cells C11, . . . , C64. In particular, if a portion of a logic circuit of the CUT contains one or more failing logic gates, failure indicating information is stored in a respective scan test cell C11, . . . , C64, for example by storing a logic high value in the respective scan test cell C11, . . . , C64. In FIG. 1, scan test cells C32 and C53 may contain such failure indicating information, as indicated by dashed backgrounds of scan test cells C32 and C53.

With each shift cycle of the clock signal CLK, each of the scan test cells C11, . . . , C64 shifts its content to a neighboring scan test cell C11, . . . , C64 of the respective scan chain SC1, . . . , SC6, in particular to the neighboring scan test cell C11, . . . , C64 arranged closer to the compactor C. For example the content of scan test cell C14 is shifted into scan test cell C13, the content of scan test cell C13 is shifted into scan test cell C12, the content of scan test cell C12 is shifted into scan test cell C11, and so forth also for the remaining scan test cells C21, . . . , C64 of the remaining scan chains SC2, . . . , SC6.

Analogously, with each shift cycle of the clock signal CLK, each of the first scan cells C11, C21, . . . , C61 shifts its content into the compactor C.

With each shift cycle, the compactor C generates bits B0, B1, . . . , B8, of a respective error signature S at an output of the compactor CO. In this way, the content of all scan test cells C11, . . . , C64 is compacted into the error signature S. In the present example, the resulting bit sequence B1, . . . , B8 of the error signature S consists of failure indicating bits B1, B3, B4, B5, B6, for example being equal to logic high, as indicated by dashed backgrounds in FIG. 1, and of non-failure indicating bits B0, B2, B7, B8, for example being equal to logic low, as indicated by blank backgrounds in Figure (FIG.) 1.

It is pointed out that the error signature S as well as the content of the scan test cells C11, . . . , C64 is chosen in FIG. 1 for explanatory reasons only and is not to be understood as limiting.

Figure 2:
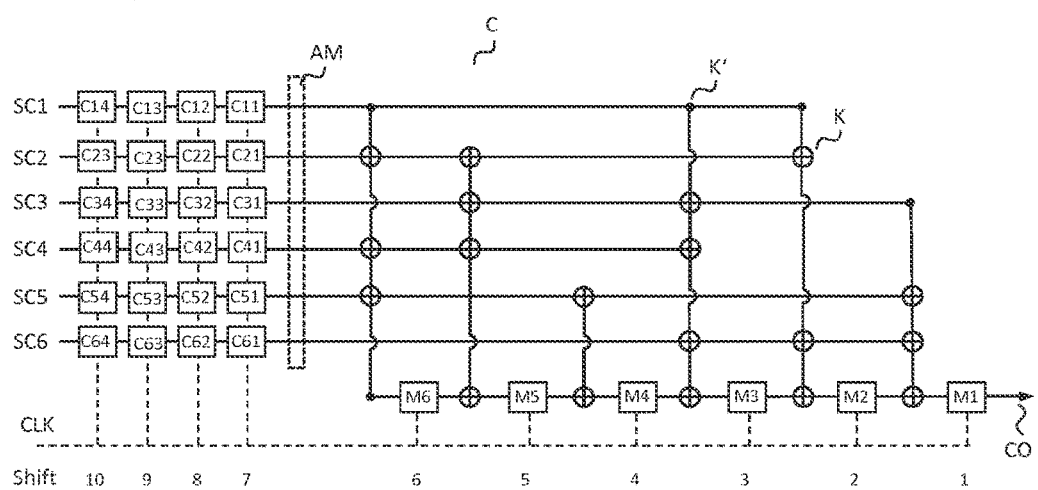
Figure 2:
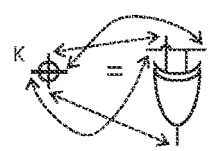

FIG. 2 shows a further exemplary implementation of a compactor C and scan test cells C11, . . . , C64 of a CUT suitable for the improved concept to be applied to. The CUT of FIG. 2 is the same as shown in FIG. 1. The operation of the compactor C of FIG. 2 is based on the operation of the compactor C of FIG. 1.

The compactor C comprises six memory elements M1, . . . , M6, wherein each of the memory elements M1, . . . , M6 is for example implemented as a flip-flop. The memory elements M1, . . . , M6 are coupled in series to each other to form a shift register and an output of the first memory element M1 represents the output of the compactor CO.

The compactor C further comprises a compactor network comprising of network nodes K, indicated by circles with crosses inside, and network nodes K', indicated by black dots. Each network node K may for example be implemented as an XOR gate, as shown at the bottom of FIG. 2. Therein, for example logic low is applied at unconnected inputs of an XOR gate. In other implementations, the network nodes K may be implemented comprising other logic gates alternatively or in addition to XOR gates. Each network node K' represents a connection of corresponding lines.

It is pointed out that the specific number of six scan chains SC1, . . . , SC6, the specific number of four scan test cells per scan chain, the specific number of six memory elements and the specific arrangement of the network nodes K coupling the scan chains SC1, . . . , SC6 to the memory elements M1, . . . , M6 is chosen in FIG. 2 for explanatory reasons only and is not to be understood as limiting. Furthermore, a method according to the improved concept may not only be applied to compactor architectures with a single compactor output CO but analogously also to compactor architectures with more than one compactor output. In this case a respective plurality of error signatures S is generated at each compactor output and each of the respective pluralities of error signatures S may be treated separately.

Each scan chain SC1, . . . , SC6 is connected to three of the memory elements M1, . . . , M6 via three respective network nodes K. Furthermore, the compactor C comprises a mask network AM, being implemented as an AND-based X-masking network. The mask network AM may for example comprise an AND gate for each scan chain SC1, . . . , SC6. The AND gates have a first input coupled to an output of the respective scan chain SC1, . . . , SC6. A second input of each AND gate is for example connected to a respective control terminal. In this way, individual scan chains SC1, . . . , SC6 can for example be effectively switched off. By this means, for example Xs may be blocked.

With each shift cycle of the clock signal CLK each of the first scan test cells C11, C21, . . . , C61 shift its content into the respective memory elements M1, . . . , M6, to which they are coupled via the respective network nodes K. Analogously, with each shift cycle, each of the memory elements M2, . . . , M6 shifts its content into a neighboring one of the memory elements M1, . . . , M5. In particular, memory element M6 shifts its content into memory element M5, memory element M5 shifts its content into memory element M4, memory element M4 shifts its content into memory element M3, memory element M3 shifts its content into memory element M2 and memory element M2 shifts its content into memory element M1.

With each shift cycle, the first memory element M1 shifts its content out of the compactor C via the compactor output CO. When shifted out of the compactor C, a corresponding bit of an error signature S may for example be stored in an output file according to the shifted out content of the first memory element M1. In this way, a plurality of error signatures S may be generated by means of the compactor C based on various test stimuli applied to the CUT one after another.

The details of how the network nodes K connect the scan test cells C11, . . . , C64 to the memory elements M1, . . . , M6 determines which bits of an error signature S may be impacted or affected by which of the scan test cells C11, . . . , C64. In a first shift cycle, the content of the first memory element M1 may be undetermined, in particular may be independent of a content of one of the scan test cells C11, . . . , C64.

For example in FIG. 2, scan test cell C11 is connected by network nodes K to the second, the third and sixth memory element M2, M3, M6 and therefore may impact bits of error signatures S associated with the third, the fourth and the seventh shift cycle. Scan test cell C12 is connected to the same network nodes K as scan test cell C11. Therefore scan test cell C12 may impact bits of error signatures associated with the fourth, the fifth and the eighth shift cycle. As another example, scan test cell C43 is connected by network nodes K to the third, the fifth and the sixth memory element M3, M5, M6 and therefore may impact bits of error signatures associated with the sixth, the eighth and the ninth shift cycle. In the same way, can be determined straight forwardly which bits of error signatures S may be impacted or affected by which of the scan test cells C11, . . . , C64.

Figure 3A:
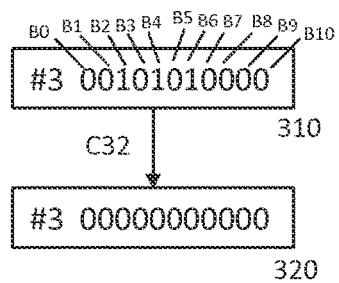
FIG. 3A shows a schematic partial representation of an embodiment of a method according to the improved concept.
Figure 3B:
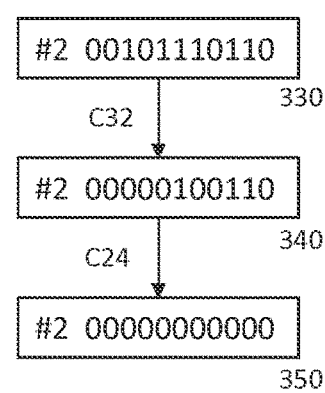
FIG. 3B shows a further schematic partial representation of an embodiment of a method according to the improved concept.

FIGS. 3A to 3B show schematic partial representations of an embodiment of a method according to the improved concept.

In particular, five error signatures #1, #2, . . . , #5 are generated by means of a compactor C as shown in FIG. 2. The error signatures #1, #2, . . . , #5 are also in table 1 below.

TABLE 1

|    | Error signature | Type | mapped in   |
|----|-----------------|------|-------------|
| #1 | 00111001000     | III  | third pass  |
| #2 | 00101110110     | II   | second pass |
| #3 | 00101010000     | I    | first pass  |
| #4 | 00111001000     | III  | third pass  |
| #5 | 01000010000     | III  | not mapped  |

Each error signature #1, #2, . . . , #5 consists of a sequence of 11 bits B0, B1, . . . , B9, B10, wherein the zero bits B0 correspond to the first shift cycle of the compactor C or of the clock CLK, respectively. The first bits B1 correspond to the second shift cycle and so forth.

According to the improved concept, a signature type is assigned to each of the error signatures #1, #2, . . . , #5 according to the total number of failure indicating bits of the respective error signature #1, #2, . . . , #5. In this course, the error signatures #1, #2, . . . , #5 are assigned to one of a first signature type, being type I signatures in the present example, to a second signature type, being type II signatures in the present example or to a third signature type, being type III signatures in the present example.

The first error signature #1 comprises four error indicating bits at bits B2, B3, B4, B7 corresponding to shift cycles three, four, five and eight. Thus, the total number of error indicating bits is not a multiple of the coupling number, which is three in the present case of the compactor C shown in FIG. 2. Therefore, type III is assigned to error signature #1 as a signature type. The second error signature #2 comprises six error indicating bits at bits B2, B4, B5, B6, B8, B9 corresponding to shift cycles three, five, six, seven, nine and ten. Thus, the total number of error indicating bits is a multiple of three. Therefore, type II is assigned to error signature #2 as a signature type. The third error signature #3 comprises three error indicating bits at bits B2, B4, B6 corresponding to shift cycles three, five, and seven. Thus, the total number of error indicating bits is equal to the coupling number of three. Therefore, type I is assigned to error signature #3. Analogously, type III is assigned to error signatures #4 and #5.

Furthermore, as an example a minimum number of error signatures to be mapped may for example be set to four. That is, the mapping may for example be stopped when four of the error signatures #1, #2, . . . , #5 are successfully mapped.

Initially, the pattern weight of each scan test cell C11, . . . , C64 is equal to 0, since no error signature #1, #2, . . . , #5 has been mapped to any of the scan test cells C11, . . . , C64 yet.

FIG. 3A represents a first pass of the mapping, during which only error signatures of the first signature type, that is in the present example type I signatures, are mapped.

According to table 1, only one error signature of type I is present, namely error signature #3. Consequently, in step 310 of FIG. 3A, error signature #3 is selected. Then, a bit weight is calculated with respect to error signature #3 for each scan test cell C11, . . . , C64 according to the architecture of the compactor C of FIG. 2. According to the compactor network of compactor C, scan test cell C32 has a bit weight of 3, since it may impact bits of error signatures associated with the third, the fifth and the seventh shift cycle. All remaining scan test cells have a bit weight of 0 in the present example.

Consequently, scan test cell C32 is selected and, for example, all bits of error signature #3 that may be affected by scan test cell C32 are inverted. The resulting modified error signature #3 is shown in step 320 and comprises no failure indicating bits anymore. Thus, error signature #3 is defined as being mapped to scan test cell C32. Furthermore, a pattern weight of scan test cell C32 is increased by one from 0 to 1.

Since no other type I signature is present, the first pass of the mapping procedure ends.

FIG. 3B represents a second pass of the mapping, during which only error signatures of the second signature type, that is in the present example type II signatures, are mapped.

According to table 1, only one error signature of type II is present, namely error signature #2. Consequently, in step 330 of FIG. 3B, error signature #2 is selected. Then, a bit weight is calculated with respect to error signature #2 for each scan test cells C11, . . . , C64. According to the compactor network of compactor C, many of the scan test cells C11, . . . , C64 have a bit weight being equal to 3, as shown in table 2 below.

TABLE 2

| scan test cell | bit weight | pattern weight |
|----------------|------------|----------------|
| C14            | 3          | 0              |
| C21            | 3          | 0              |
| C24            | 3          | 0              |
| C32            | 3          | 1              |
| C44            | 3          | 0              |
| C64            | 3          | 0              |

Table 2 lists scan test cells that have a bit weight of 3 with respect to error signature #2. Furthermore, the respective pattern weight of the scan test cells at the beginning of the second pass is shown.

Since more than only one scan test cell has the maximum bit weight of 3, scan test cell C32 is selected, since it has a maximum pattern weight with respect to the other scan test cells C14, C21, C24, C44, C64.

Then, for example, all bits of error signature #2 that may be affected by scan test cell C32 are inverted. The resulting modified error signature #2 is shown in step 340 and comprises now three failure indicating bits.

Then, a bit weight is calculated with respect to the modified error signature #2 for each scan test cell C11, . . . , C64 according to the architecture of the compactor C of FIG. 2. According to the compactor network of compactor C, scan test cell C24 as a bit weight of 3, since it may impact bits of error signatures associated with the sixth, the ninth and the tenth shift cycle. All remaining scan test cells have a bit weight of 0 in the present example.

Consequently, scan test cell C24 is selected and, for example, all bits of the modified error signature #2 that may be affected by scan test cell C24 are inverted. The resulting modified error signature #2 is shown in step 350 and comprises no failure indicating bits anymore. Thus, error signature #2 is defined as being mapped to scan test cells C32 and C24. Furthermore, a pattern weight of scan test cell C32 is increased by one from 1 to 2 and a pattern weight of scan test cell C24 is increased from 0 to 1.

Since no other type II signature is present, the first pass of the mapping procedure ends.

Figure 3C:
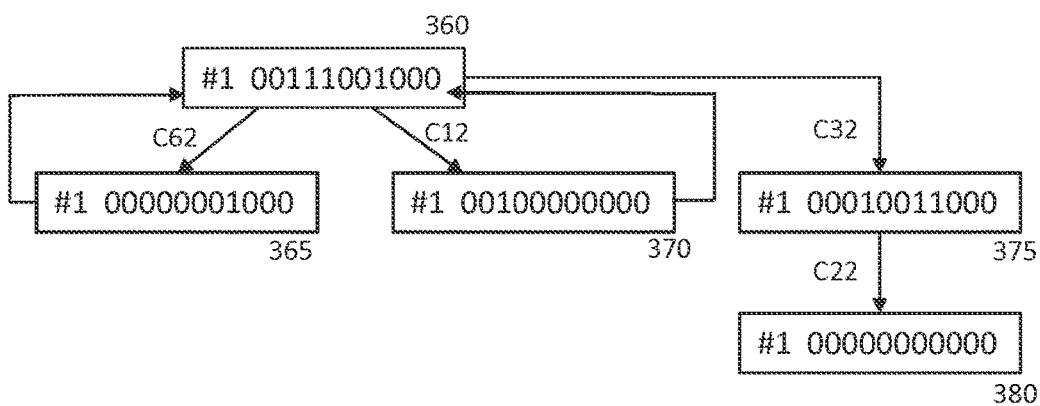
FIG. 3C shows a further schematic partial representation of an embodiment of a method according to the improved concept.

FIG. 3C represents a third pass of the mapping, during which only error signatures of the third signature type, that is in the present example type III signatures, are mapped.

According to table 1, three error signatures of type III are present, namely error signatures #1, #4, and #5. Consequently, in step 360 of FIG. 3C, for example error signature #1 is selected.

Since error signature #1 has four failure indicating bits a cell limitation may be set to 2, that is, the mapping algorithm to for example try first to find a set of two scan test cells C11, . . . , C64 to which error signature #1 can be mapped. If no such set of two scan test cells C11, . . . , C64 can be found, the cell limitation may be increased to three.

A bit weight is calculated with respect to error signature #1 for each scan test cells C11, . . . , C64. According to the compactor network of compactor C, scan test cells C62 and C12 have a bit weight being equal to 3. Furthermore, scan test cells C62 and C12 each have a pattern weight of 0. Therefore, either scan test cell C62 or scan test cell C12 may be selected. In the present example, for example scan test cell C62 is selected.

Then, for example, all bits of error signature #1 that may be affected by scan test cell C62 are inverted. The resulting modified error signature #1 is shown in step 365 and comprises now one failure indicating bit. However, a single scan test cell cannot explain the modified error signature #1 of step 365. Since the cell limitation is set to 2, it is proceeded by re-inverting all bits of error signature #1 that may be affected by scan test cell C62, resulting again in the original error signature #1 of step 360.

Then, for example scan test cell C12 is selected. All bits of error signature #1 that may be affected by scan test cell C12 are inverted. The resulting modified error signature #1 is shown in step 370 and comprises now one failure indicating bit. However, a single scan test cell cannot explain the modified error signature #1 of step 370. Since the cell limitation is set to 2, it is proceeded by re-inverting all bits of error signature #1 that may be affected by scan test cell C12, resulting again in the original error signature #1 of step 360.

According to the compactor network of compactor C, several scan test cells have a bit weight being equal to 2 including scan test cells C32, C22, C52, C63, etc. Therefore, scan test cell C32 is selected, as having the maximum pattern weight of 2. All bits of error signature #1 that may be affected by scan test cell C32 are inverted. The resulting modified error signature #1 is shown in step 375 and comprises three failure indicating bits.

Then, a bit weight is calculated with respect to the modified error signature #1 of step 375 for each scan test cell C11, . . . , C64 according to the architecture of the compactor C of FIG. 2. According to the compactor network of compactor C, scan test cell C22 as a bit weight of 3, since it may impact bits of error signatures associated with the fourth, the seventh and the eighth shift cycle. All remaining scan test cells have a bit weight of 0 in the present example.

Consequently, scan test cell C22 is selected and, for example, all bits of the modified error signature #1 that may be affected by scan test cell C22 are inverted. The resulting modified error signature #1 is shown in step 380 and comprises no failure indicating bits anymore. Thus, error signature #1 is defined as being mapped to scan test cells C32 and C22. Furthermore, a pattern weight of scan test cell C32 is increased by one from 2 to 3 and a pattern weight of scan test cell C22 is increased from 0 to 1.

As a next error signature, error signature #4 would be selected. However, since error signature #4 has the same failure indicating bits as error signature #1, all failures that explain error signature #1 also explain error signature #4. Thus, error signature #4 is defined as being mapped to scan test cells C32 and C22.

In the first, the second and the third pass, error signatures #1, #2, #3 and #4 have been explained already. Since the minimum number of error signatures to be mapped is set to four, the mapping is for example stopped at this point skipping error signature #5, which will not be mapped in the present example.

Based on the results from the mapping, a scan diagnosis algorithm may for example determine one or more portions of the CUT containing at least one failing logic gate.

According to the improved concept, different kinds of error signatures may be identified and a mapping priority according to the assigned signature types is used.

According to the improved concept, failure indicating scan test cells of a CUT may be identified particularly efficiently and with a reduced time requirement. In particular, an iteration between mapping of error signatures to respective scan test cells of the CUT and scan based fault diagnosis is not necessary according to the improved concept.

Furthermore, due to the assignment of the error signatures to different signature types according to a total number of failure indicating bits and a prioritization of the mapping according to the assigned signature types, an increased reliability and/or effectivity of the mapping may be achieved. In particular, this is achieved by mapping over different passes targeting first to error signatures which are easier to map and then using information gathered from the earlier passes, for example with respect to the pattern weight, formatting error signatures being more difficult to map in later passes.

In addition, the methods described may be implemented through computer program product (or program code). The program product is executable by one or more processors (and/or processing units such as controllers). In addition, the methods may be embodied within systems having hardware configurations as disclosed.

What is claimed is:

1. A method for identifying at least one failure indicating scan test cell of an integrated circuit-under-test (CUT) the CUT having a plurality of scan test cells, the method comprising
generating a plurality of error signatures by means of a compactor of the CUT, each of the error signatures of the plurality of error signatures having a respective sequence of bits comprising at least one failure indicating bit;
assigning each error signature of the plurality of error signatures to one of at least a first, a second and a third signature type according to a total number of failure indicating bits of the respective error signature; and
mapping at least a predefined minimum number of error signatures of the plurality of error signatures to respective scan test cells of the plurality of scan test cells,
for each error signature of the plurality of error signatures, a priority for the mapping determined by the signature type the respective error signature has been assigned to.

2. The method of claim 1, wherein the mapping is performed for error signatures being assigned to the second signature type only when all of the error signatures being assigned to the first signature type have been mapped to respective scan test cells of the plurality of scan test cells.

3. The method of claim 1, wherein the mapping is performed for error signatures being assigned to the third signature type when at least one of (i) all of the error signatures being assigned to the first signature type have been mapped to respective scan test cells of the plurality of scan test cells and (ii) all of the error signatures being assigned to the second signature type have been mapped to respective scan test cells of the plurality of scan test cells.

4. The method of claim 1, further comprising determining a portion of a logic circuit of the CUT containing at least one failing logic gate based on the mapping of the at least a predefined minimum number of error signatures of the plurality of error signatures to respective scan test cells of the plurality of scan test cells.

5. The method of claim 1, wherein
the scan test cells of the plurality of scan test cells are arranged in a plurality of scan chains;
the compactor comprises a plurality of memory elements each having a respective input; and
each scan chain comprises an output coupled to each of the respective inputs of each memory element of a respective subset of the plurality of memory elements, each of said respective subsets comprising a coupling number of memory elements.

6. The method according to claim 5, wherein
the coupling number is equal for each of said subsets of memory elements; and
an error signature is assigned to the first signature type if the total number of failure indicating bits of the respective error signature is equal to the coupling number.

7. The method of claim 5, wherein an error signature is assigned to the second signature type if the total number of failure indicating bits of the respective error signature is equal to an integer multiple of the coupling number but not equal to the coupling number.

8. The method of claim 5, wherein an error signature is assigned to the third signature type if the total number of failure indicating bits of the respective error signature is not equal to an integer multiple of the coupling number and not equal to the coupling number.

9. The method of claim 1, wherein the mapping of at least a predefined minimum number of error signatures of the plurality of error signatures to respective scan test cells of the plurality of scan test cells comprises
selecting an error signature of the plurality of error signatures; and
determining for each of the scan test cells of the plurality of scan test cells a respective bit weight, wherein the bit weight corresponds to a number of failure indicating bits of the selected error signature that may be caused by the scan test cell for which the respective bit weight is being determined.

10. The method of claim 9, wherein the mapping of at least a predefined minimum number of error signatures of the plurality of error signatures to respective scan test cells of the plurality of scan test cells further comprises, if the selected error signature has been assigned to the first signature type,
selecting a scan test cell of the plurality of scan test cells having a maximum bit weight; and
defining the selected error signature as being mapped to the selected scan test cell; and
increasing a pattern weight of the selected scan test cell by one, wherein the pattern weight corresponds to a number of error signatures having already been mapped to the selected scan test cell.

11. The method of claim 9, wherein the mapping of at least a predefined minimum number of error signatures of the plurality of error signatures to respective scan test cells of the plurality of scan test cells further comprises, if the selected error signature has been assigned to the second or to the third signature type,
selecting a scan test cell of the plurality of scan test cells having a maximum bit weight and, if more than one scan test cell of the plurality of scan test cells has the maximum bit weight, having a maximum pattern weight,
the pattern weight of a respective scan test cell corresponding to a number of error signatures having already been mapped to the respective scan test cell; and
inverting each of the bits of the selected error signature that may be affected by the selected scan test cell.

12. The method of claim 11, wherein, if the selected error signature has been assigned to the second or the third signature type, the steps of
determining for each of the scan test cells of the plurality of scan test cells a respective bit weight,
selecting a scan test cell of the plurality of scan test cells, and
inverting each of the bits of the selected error signature that may be affected by the selected scan test cell,
are carried out repeatedly in a cyclic manner until the selected error signature does not comprise any failure indicating bits.

13. The method of claim 11, wherein the mapping of at least a predefined minimum number of error signatures of the plurality of error signatures to respective scan test cells of the plurality of scan test cells further comprises, if the selected error signature has been assigned to the second or to the third signature type,
defining the selected error signature as being mapped to the selected scan test cell; and
increasing the pattern weight of the selected scan test cell by one.

14. The method of claim 1, further comprising
determining a subset of error signatures of the plurality of error signatures, wherein each error signature of the subset of error signatures has the same sequence of bits;
mapping one representing error signature of the subset of error signatures to one or more respective scan test cells of the plurality of scan test cells; and
defining all error signatures of the subset of error signatures as being mapped to the one or more respective scan test cells the representing error signature has been mapped to.

15. A method for identifying at least one failure indicating scan test cell of an integrated circuit-under-test, CUT, the CUT having a plurality of scan test cells, the method comprising
generating a plurality of error signatures by means of a compactor of the CUT, each of the error signatures of the plurality of error signatures having a respective sequence of bits comprising at least one failure indicating bit;
assigning each error signature of the plurality of error signatures to one of at least a first and a second signature type according to a total number of failure indicating bits of the respective error signature; and mapping at least a predefined minimum number of error signatures of the plurality of error signatures to respective scan test cells of the plurality of scan test cells;

for each error signature of the plurality of error signatures, a priority for the mapping is determined by the signature type the respective error signature has been assigned to.

16. The method of claim 15, wherein the mapping is performed for error signatures being assigned to the second signature type only when all of the error signatures being assigned to the first signature type have been mapped to respective scan test cells of the plurality of scan test cells.

17. The method of claim 15, further comprising determining a portion of a logic circuit of the CUT containing at least one failing logic gate based on the mapping of the at least a predefined minimum number of error signatures of the plurality of error signatures to respective scan test cells of the plurality of scan test cells.

18. The method of claim 15, wherein the scan test cells of the plurality of scan test cells are arranged in a plurality of scan chains, the compactor comprises a plurality of memory elements each having a respective input, and each scan chain comprises an output coupled to each of the respective inputs of each memory element of a respective subset of the plurality of memory elements, each of said respective subsets comprising a coupling number of memory elements.

19. The method of claim 18, wherein the coupling number is equal for each of said subsets of memory elements.

20. A non-transitory storage medium having a computer program product comprising a code, wherein said code, when executed by at least one processor, causes the at least one processor to:

generate a plurality of error signatures by means of a compactor of the CUT, each of the error signatures of the plurality of error signatures having a respective sequence of bits comprising at least one failure indicating bit;

assign each error signature of the plurality of error signatures to one of at least a first and a second signature type according to a total number of failure indicating bits of the respective error signature; and map at least a predefined minimum number of error signatures of the plurality of error signatures to respective scan test cells of the plurality of scan test cells;

for each error signature of the plurality of error signatures, a priority for the mapping is determined by the signature type the respective error signature has been assigned to.

21. The non-transitory storage medium having the computer program product of claim 20, wherein the code to map further comprises code to map for performing error signatures being assigned to the second signature type only when all of the error signatures being assigned to the first signature type have been mapped to respective scan test cells of the plurality of scan test cells.

22. The non-transitory storage medium having the computer program product of claim 20, wherein the code to map further comprises code to map for error signatures being assigned to a third signature type only when at least one of (i) all of the error signatures being assigned to the first signature type have been mapped to respective scan test cells of the plurality of scan test cells and (ii) all of the error signatures being assigned to the second signature type have been mapped to respective scan test cells of the plurality of scan test cells.

23. The non-transitory storage medium having the computer program product of claim 20, further comprising code to determine a portion of a logic circuit of the CUT containing at least one failing logic gate based on the mapping of the at least a predefined minimum number of error signatures of the plurality of error signatures to respective scan test cells of the plurality of scan test cells.

24. The non-transitory storage medium having the computer program product of claim 20, wherein the code to map further comprises code to map at least a predefined minimum number of error signatures of the plurality of error signatures to respective scan test cells of the plurality of scan test cells and further comprises code to select an error signature of the plurality of error signatures; and determine for each of the scan test cells of the plurality of scan test cells a respective bit weight, wherein the bit weight corresponds to a number of failure indicating bits of the selected error signature that may be caused by the scan test cell for which the respective bit weight is being determined.

* * * * *